United States Patent [19]
Narui et al.

[11] Patent Number: 5,920,587
[45] Date of Patent: *Jul. 6, 1999

[54] OPTICAL DEVICE AND METHOD OF MANUFACTURING THE SAME

[75] Inventors: Hironobu Narui; Masato Doi; Kenji Sahara; Yoshinobu Higuchi, all of Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/801,169

[22] Filed: Feb. 18, 1997

Related U.S. Application Data

[63] Continuation of application No. 08/494,768, Jun. 26, 1995.

[30] Foreign Application Priority Data

Jun. 30, 1994 [JP] Japan ................................ P06-150016

[51] Int. Cl.$^6$ ..................................................... H01S 3/18
[52] U.S. Cl. ................................ 372/50; 372/43; 257/84; 257/85
[58] Field of Search .......................... 372/43, 50; 257/84, 257/85

[56] References Cited

U.S. PATENT DOCUMENTS

| 4,181,901 | 1/1980 | Heyke ........................................ 372/31 |
| 4,860,276 | 8/1989 | Ukita et al. ............................. 369/119 |
| 5,040,033 | 8/1991 | Dutta et al. ............................... 357/19 |
| 5,113,071 | 5/1992 | Sawada et al. ......................... 250/237 |
| 5,162,878 | 11/1992 | Sasagawa et al. ....................... 372/45 |
| 5,608,233 | 3/1997 | Sahara et al. ............................ 372/50 |

FOREIGN PATENT DOCUMENTS

| 61-80887 | 4/1986 | Japan ........................................ 372/50 |
| 62-93990 | 4/1987 | Japan ........................................ 372/43 |
| 1-27289 | 1/1989 | Japan ........................................ 372/43 |
| 3-230571 | 10/1991 | Japan ........................................ 257/84 |

*Primary Examiner*—Rodney Bovernick
*Assistant Examiner*—Yisun Song
*Attorney, Agent, or Firm*—Hill & Simpson

[57] ABSTRACT

A semiconductor laser device having light output monitoring light-receiving portion can be fabricated monolithically. A semiconductor laser element (LD) composed of a first cladding layer (22), an active layer (23) and a second cladding layer (24) is formed on a semiconductor substrate (21). A light-receiving portion (PD$_1$) of a pn junction is formed on the semiconductor substrate (21) disposed behind the semiconductor laser element (LD) by diffusion or selective growth.

9 Claims, 10 Drawing Sheets

OPTICAL DEVICE AND METHOD OF MANUFACTURING THE SAME

This is a continuation, of application Ser. No. 08/494,768 filed Jun. 26, 1995.

BACKGROUND OF THE INVENTION

The present invention relates to an optical semiconductor device, such as a semiconductor laser and a light-emitting diode having a light-emitting portion and a light-receiving portion for monitoring a light output of the light-emitting portion and a method of manufacturing the optical semiconductor device.

It is customary that semiconductor laser devices, for example, positively keep a light output emitted forward from a semiconductor laser element constant by monitoring a light output from a semiconductor laser element.

Figure 1:
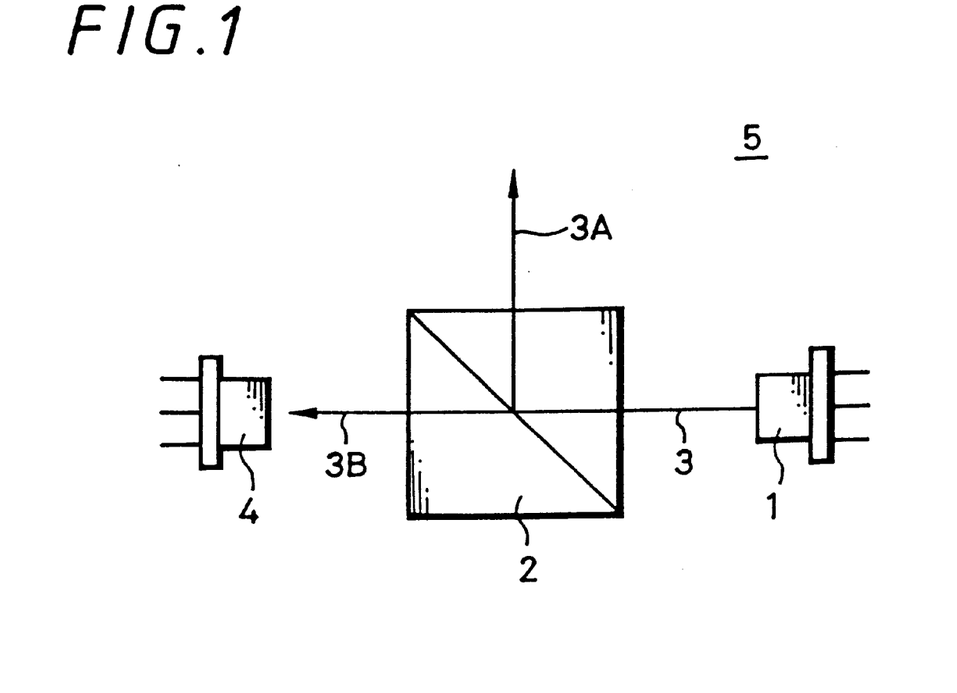
FIG. 1 is a schematic diagram showing an example of a semiconductor laser device.

FIG. 1 of the accompanying drawings shows an example of a semiconductor laser device. As shown in FIG. 1, a semiconductor laser device 5 is composed of a semiconductor laser element 1, a beam splitter 2 and a photodiode 4. In this semiconductor laser device 5, a light output from the semiconductor laser element 1 is monitored as follows. That is, the beam splitter 2 divides a light output 3 emitted forward from the semiconductor laser element 1 to provide light 3A and light 3B. The light 3A that was reflected by the beam splitter 2 radiates a radiated object (not shown). Then, the photodiode 4 receives the light 3B passed the beam splitter 2 upon monitoring.

Figure 2:
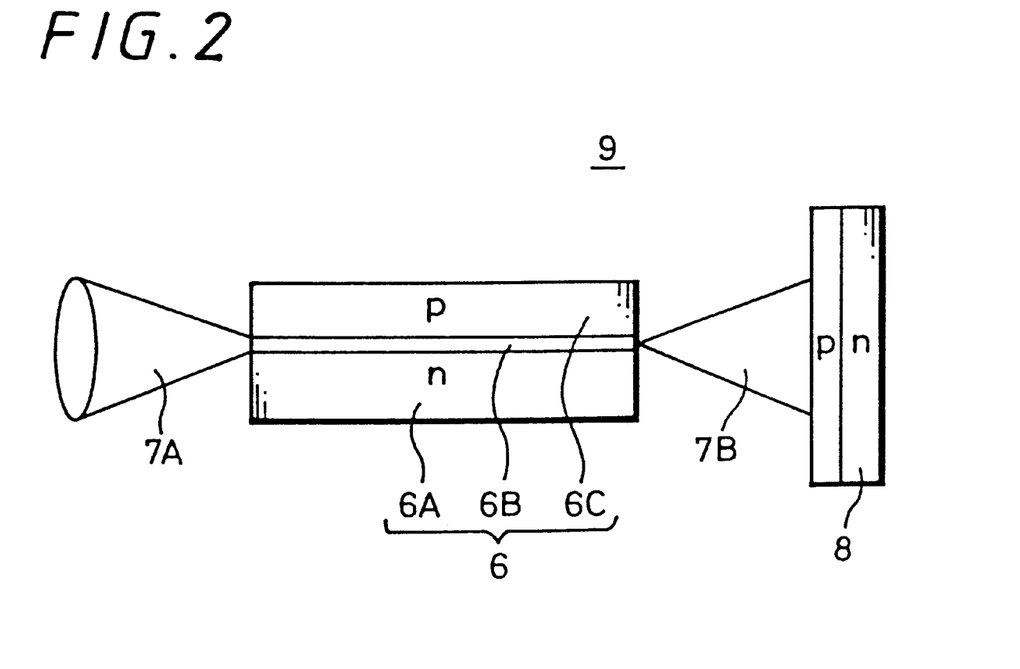
FIG. 2 is a schematic diagram showing other example of a semiconductor laser device.

FIG. 2 shows other example of a semiconductor laser device. As shown in FIG. 2, a semiconductor laser device 9 is composed of a semiconductor laser chip 6 formed of a first cladding layer 6A, an active layer 6B and a second cladding layer 6C and an externally-connected photodiode 8. In this semiconductor laser device 9, the externally-connected photodiode 8 detects a light output 7B emitted rearward from the semiconductor laser chip 6 which also emits a light output 7A forward.

Figure 3:
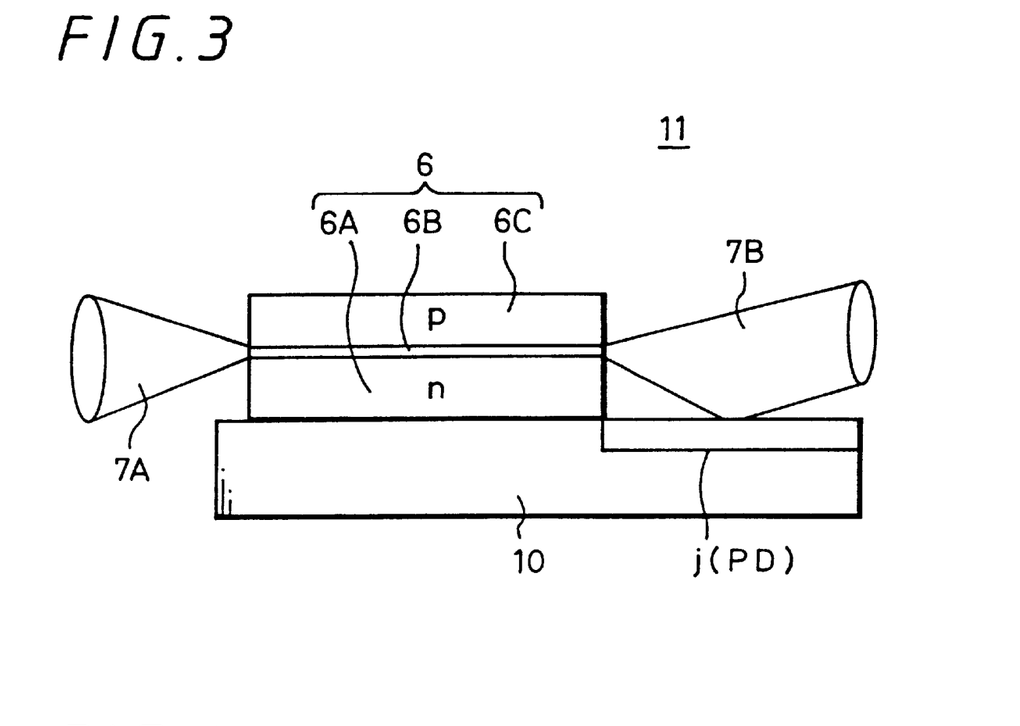
FIG. 3 is a schematic diagram showing a further example of a semiconductor laser device.

Further, FIG. 3 shows other example of a semiconductor laser device. As shown in FIG. 3, a semiconductor laser device 11 is composed of the semiconductor laser chip 6 formed of the first cladding layer 6A, the active layer 6B and the second cladding layer 6C and a silicon sub-mount substrate 10 having a pn junction j (i.e., photodiode PD) on which the semiconductor laser chip 6 is mounted. Thus, the semiconductor laser device 11 is of the so-called LOP (laser on photodiode) structure wherein the pn junction j on the silicon sub-mount substrate 10 detects a light output 7B emitted from the rearward of the semiconductor laser chip 6. The semiconductor laser devices 5, 9 and 11 are all built in a hybrid fashion.

Figure 4:
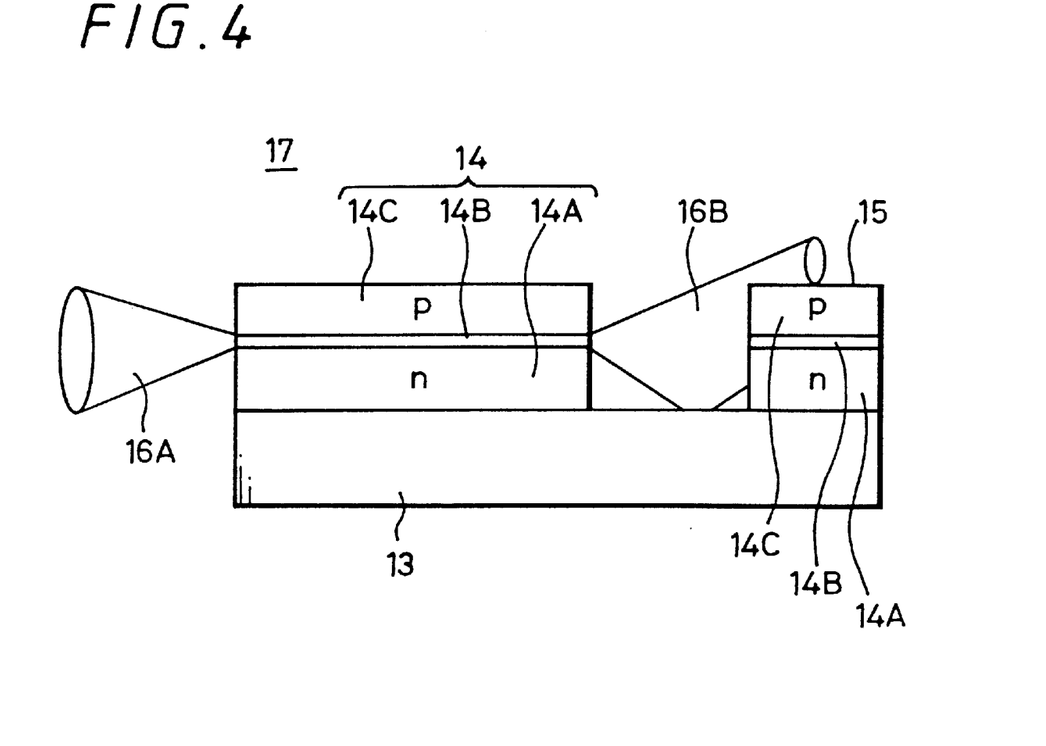
FIG. 4 is a schematic diagram showing yet a further example of a semiconductor laser device.

Furthermore, FIG. 4 shows other example of a semiconductor laser device. As shown in FIG. 4, a semiconductor laser device 17 is composed of a semiconductor substrate 13, a semiconductor laser element 14 formed of an n-type first cladding layer 14A, an active layer 14B and a p-type second cladding layer 14C and a light-receiving portion 15. In this case, in order to form the light-receiving portion 15 in a monolithic fashion, semiconductor layers forming the n-type first cladding layer 14A, the active layer 14B and the p-type second cladding layer 14C are laminated on the semiconductor substrate 13. Then, the semiconductor laser element 14 formed of the same laminated semiconductor layer and the light-receiving portion 15 opposing a resonator end face formed behind the semiconductor laser element 14 are monolithically formed by patterning. The light receiving portion 15 receives a light output 16B emitted from the rearward of the semiconductor laser element 14 thereby to keep light 16A emitted forward from the semiconductor laser element 14 constant.

The semiconductor laser devices 4 and 9 shown in FIGS. 1 and 2 need assemblies, such as the beam splitter 2 and the photodiodes 4, 8. Therefore, they cannot be miniaturized satisfactorily and also cannot be optically disposed with a high alignment accuracy.

The semiconductor laser device 11 shown in FIG. 3 can be miniaturized but cannot be optically disposed with a high alignment accuracy.

Furthermore, the semiconductor laser device 17 shown in FIG. 4 encountered with the problem such that the light 16B emitted from the semiconductor laser element 14 is received only by the thin active layer 14B of the light-receiving portion 15. Therefore, the semiconductor laser device 17 has a small light-receiving area and is very low in sensitivity.

SUMMARY OF THE INVENTION

In view of the aforesaid aspect, it is an object of the present invention to provide an optical semiconductor device which can be miniaturized and a method of manufacturing the same.

It is another object of the present invention to provide an optical semiconductor device which need not be disposed optically with a high alignment accuracy and a method of manufacturing the same.

It is a further object of the present invention to provide an optical semiconductor device in which a monitoring light-receiving portion can be enhanced in sensitivity and a method of manufacturing the same.

According to an aspect of the present invention, there is provided an optical semiconductor device which is comprised of a semiconductor substrate, a light-emitting portion composed of a first cladding layer, an active layer and a second cladding layer, the light-emitting portion being formed on the semiconductor substrate, and a light-receiving portion for monitoring light output formed on the semiconductor substrate at its portion placed behind the light-emitting portion by a pn junction.

According to another aspect of the present invention, there is provided a method of manufacturing an optical semiconductor device which comprises the steps of forming a laminated film on a semiconductor substrate to form a light-emitting portion composed of a first cladding layer, an active layer and a second cladding layer, forming the light-emitting portion by patterning the laminated film, and forming a light output monitoring light-receiving portion of a pn junction on the semiconductor substrate provided behind the light-emitting portion.

DETAILED DESCRIPTION OF THE PREFERRED EMBODIMENTS

An optical semiconductor device and a method of manufacturing the same according to the embodiments of the present invention will hereinafter be described with reference to the drawings.

FIGS. 5A through 5D are side views showing an optical semiconductor laser device and a method of manufacturing the same according to the embodiment of the present invention, respectively.

Figure 5A:
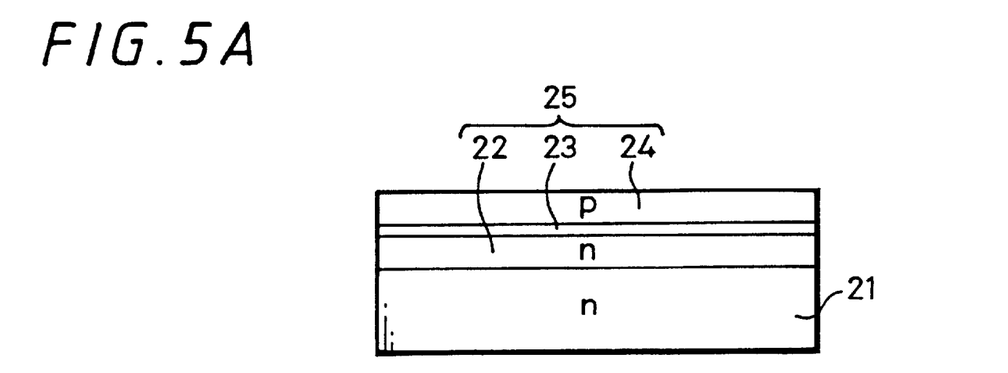
FIGS. 5A through 5D are respectively side views of an optical semiconductor laser device according to a first embodiment of the present invention and to which references will be made in explaining manufacturing processes of the optical semiconductor device.

Initially, as shown in FIG. 5A, a laminated film 25 having a double hetero structure is formed by epitaxially growing a n-type AlGaAs first cladding layer 22 whose conductivity type is the same as that of a substrate 21 forming a semiconductor laser element, an AlGaAs or GaAs, in this embodiment, AlGaAs active layer 23 and a p-type AlGaAs second cladding layer 24 whose conductivity type is a second conductivity type different from that of the first cladding layer 22 on the first conductivity type, e.g., n-type single crystal GaAs substrate 21 having a {100} crystal plane as a major surface. Crystals of the first cladding layer 22, the active layer 23 and the second cladding layer 24 are grown by MOCVD (metal organic chemical vapor deposition).

Figure 5B:
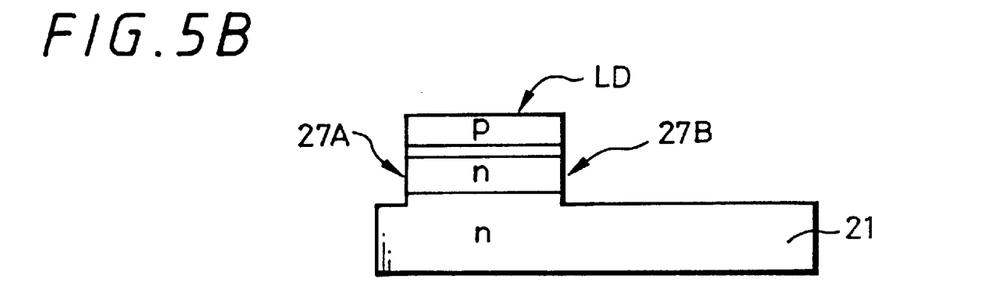

Then, as shown in FIG. 5B, the laminated film 25 is selectively etched so as to reach the substrate 21 perpendicularly by dry etching or wet etching based on RIE (reactive ion etching).

Both end faces formed on the laminated film 25 by the etching surfaces are served as resonator end faces 27A, 27B. A horizontal resonator of a semiconductor laser element LD is built between the two end faces 27A and 27B. In this case, current blocking regions are finally formed so as to sandwich the horizontal resonator area of the semiconductor laser element LD by ion implantation of impurities, though not shown.

When the laminated film 25 is etched, the rear surface of the semiconductor laser element LD, i.e., the surface of the substrate 21 on the resonator end face 27B side is selectively etched so as to face an area which is large enough to form a photodiode for monitoring a light output.

Figure 5C:
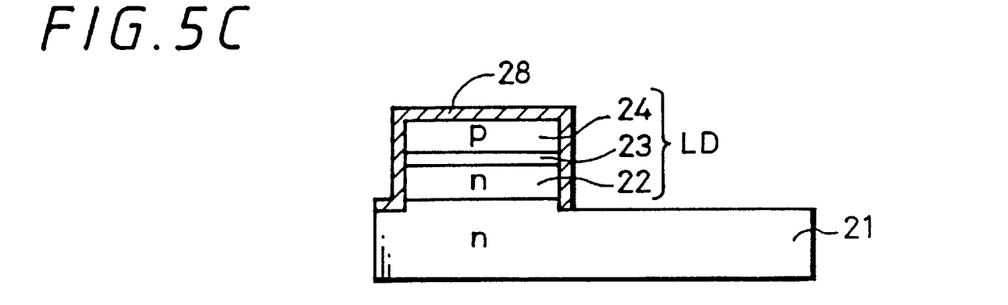

Then, as shown in FIG. 5C, after the semiconductor laser LD was formed, an insulating film 28 serving as a mask layer, such as an $SiO_2$ film and an SiN film is deposited so as to cover the upper surface of the semiconductor laser LD and the resonator end faces 27A, 27B.

Figure 5D:
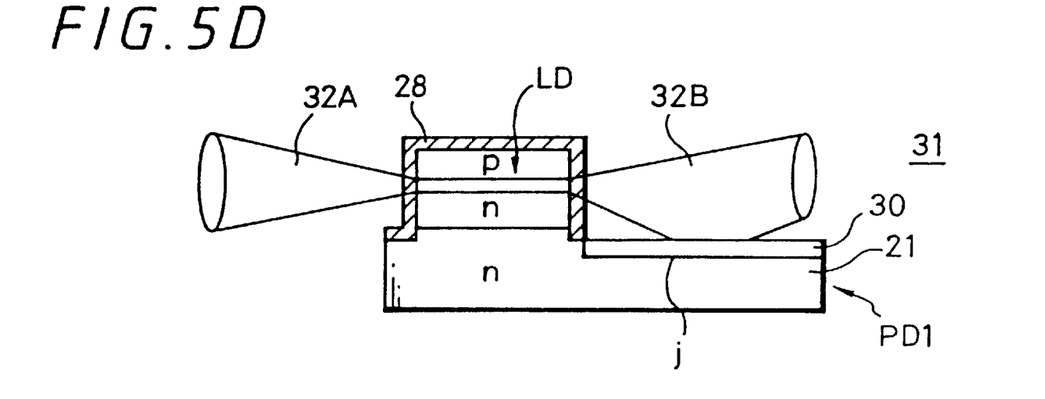

Subsequently, as shown in FIG. 5D, a p-type GaAs layer 30 is formed on the surface of the n-type GaAs substrate 21 formed behind the semiconductor laser element LD by diffusing Zn which is a p-type impurity. A photodiode $PD_1$ for monitoring a light output formed of a pn junction j is formed on the p-type GaAs layer 30.

As described above, there can be obtained a target semiconductor laser device 31 in which a semiconductor laser element LD is formed on the n-type GaAs substrate 21 by the growth of crystal and the photodiode $PD_1$ is monolithically formed on the surface of the substrate 21 formed behind the semiconductor laser element LD by diffusion.

In this semiconductor laser device 31, laser light 32A of constant power is emitted from the front resonator end face 27A of the semiconductor laser element LD. On the other hand, laser light 32B output from the rear resonator end face 27B of the semiconductor laser element LD is diverged so that the laser light 32A can be received by the light output monitoring photodiode $PD_1$ formed on the surface of the substrate 21. An output signal of the photodiode $PD_1$ is fed back to the semiconductor laser element LD, thus to make it possible to keep the intensity of the laser light 32A emitted from the front of the semiconductor laser element, LD constant.

According to this semiconductor laser device 31, since the semiconductor laser element LD and the photodiode $PD_1$ for monitoring power are monolithically formed on the same n-type GaAs substrate 21 by diffusion, the semiconductor laser device 31 can be miniaturized. In addition, an alignment such as adjustment of an optical axis extended between the semiconductor laser element LD and the photodiode $PD_1$ becomes unnecessary. Furthermore, since the photodiode $PD_1$ is composed of the pn junction, the light receiving area of this semiconductor laser device 31 can be widened and the semiconductor laser device 31 can be improved in sensitivity as compared with the example of the semiconductor laser device shown in FIG. 4.

Figure 6A:
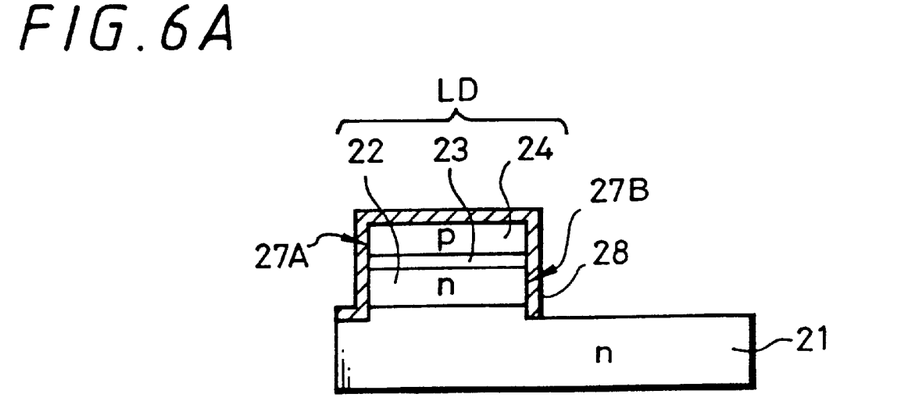
FIGS. 6A to 6C are respectively side views of an optical semiconductor laser device according to a second embodiment of the present invention and to which reference will be made in explaining manufacturing processes of the optical semiconductor device.
Figure 6B:
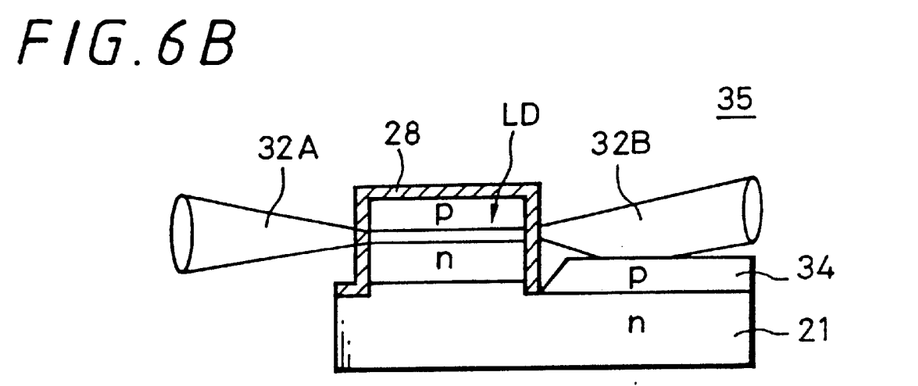
Figure 6C:
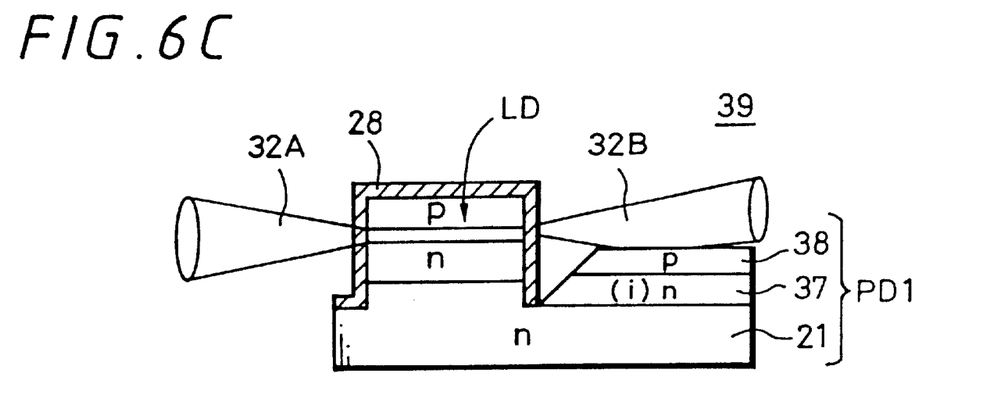

FIGS. 6A through 6C show a semiconductor laser device according to a second embodiment of the present invention and to which reference will be made in explaining a manufacturing method thereof.

According to this embodiment, as shown in FIG. 6A, the semiconductor laser element LD composed of the n-type AlGaAs first cladding layer 22, the AlGaAs or GaAs, in this embodiment, AlGaAs active layer 23 and the p-type AlgaAs second cladding layer 24 is formed on the n-type GaAs substrate 21 by similar manufacturing processes to those of FIGS. 5A to 5C. Then, the insulating film 28 is formed so as to cover the upper surface of the semiconductor laser element LD and the resonator end faces 27A, 27B.

Then, as shown in FIG. 6B, a p-type GaAs layer 34 is formed on the surface of the n-type GaAs substrate 21 formed behind the semiconductor laser element LD by growing crystal. At that time, when crystal is grown by using organic metal, such as trimethyl gallium or trimethyl aluminum by MOCVD, crystal is not grown on the insulating film 28 but can be selectively grown only on the GaAs substrate 21.

Facets, such as {111} A plane, {111} B plane and {110} plane are formed from the bottom of the resonator end face 27B. The way that these crystal planes are formed depends on the direction in which the semiconductor laser element LD is formed. Since these crystal planes function only to monitor the backward laser light, precise facets are not required but it is sufficient that facets are determined depending on the use of the forward laser light of the laser element LD, i.e., the resonator direction.

In this way, there can be obtained a target semiconductor laser device 34 in which the semiconductor laser element LD is formed on the n-type GaAs substrate 21 by growing crystal and a light output monitoring photodiode $PD_1$ of pn junction wherein a p-type GaAs layer 34 is formed by growing crystal is formed on the n-type GaAs substrate 21 provided behind the laser element LD.

The process shown in FIG. 6A proceeds to a process shown in FIG. 6C, wherein a light output monitoring photodiode $PD_1$ composed of a n-type GaAs layer 37 and a p-type GaAs layer 38 and a pn junction is formed on the rear n-type GaAs substrate 21 of the semiconductor laser element LD by growing crystal. In this case, the n-type GaAs layer 37 is lightly-doped by impurity as compared with the n-type GaAs substrate 21. The layer 37 can be formed of an i-type GaAs layer.

In this way, there can be obtained a target semiconductor laser device 39 wherein the semiconductor laser element LD is formed on the n-type GaAs substrate 21 by growing crystal and a light output monitoring photodiode $PD_1$ composed of the GaAs n-type layer (or i-type layer) 37 and the p-type layer 38 is formed on the rear n-type GaAs substrate 21 of the laser element LD by growing crystal.

While only the GaAs layers are formed by growing crystal as shown in FIGS. 6A to 6C, in order to absorb laser light, it is sufficient that the p-type layer 34 shown in FIG. 6B and both of or either of the n-type (i-type) layer 37 and the p-type layer 38 are grown by $Al_xGaAs$ layer of less than Al composition (x) of active layer.

Further, even when the pn junction is formed by the GaAs layer, if a p-type $Al_xGaAs$ layer of greater than Al composition (x) of active layer is formed on the p-type GaAs layers 34, 38 to provide a window structure, then it is possible to improve a sensitivity.

According to the semiconductor laser devices 35 and 39 shown in FIGS. 6B and 6C, since the semiconductor laser element LD formed by growing crystal and the light output monitoring photodiode $PD_1$ formed by growing crystal are formed on the same n-type GaAs substrate monolithically, the semiconductor laser device can be miniaturized and the alignment, such as alignment of optical axis need not be made. Further, since the photodiode $PD_1$ is formed by the pn junction, it is possible to improve a sensitivity as compared with the example shown in FIG. 4.

Figure 7A:
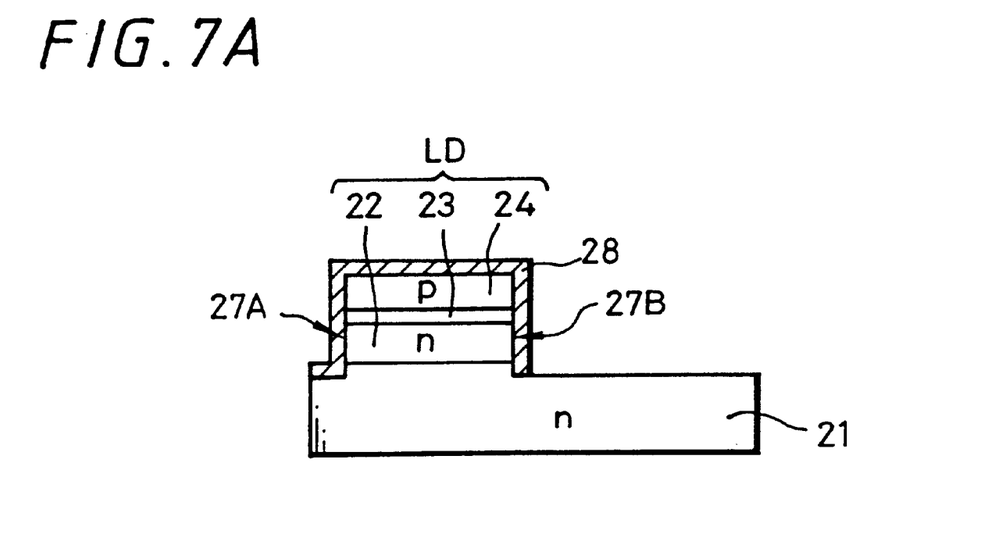
FIGS. 7A and 7B are respectively side views of an optical semiconductor laser device according to a third embodiment of the present invention and to which reference will be made in explaining manufacturing processes of the optical semiconductor device.
Figure 7B:
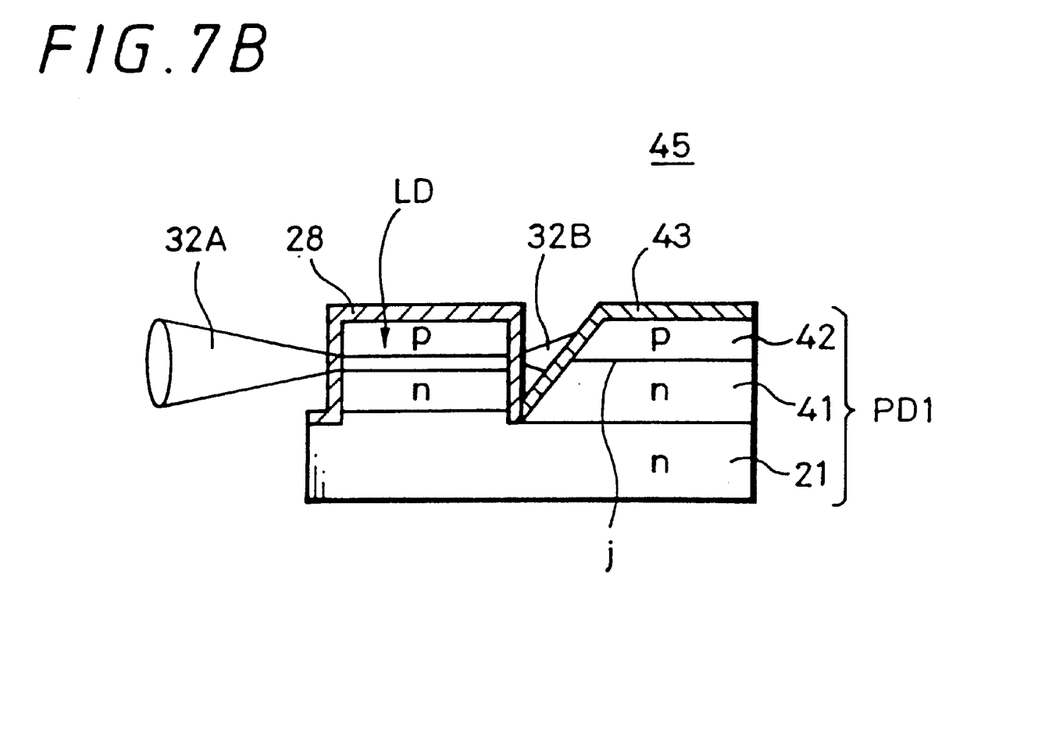

FIGS. 7A, 7B and 7C show a semiconductor laser device according to a third embodiment of the present invention and a manufacturing method thereof.

According to this embodiment, as shown in FIG. 7A, through similar steps shown in FIGS. 5A to 5C, a semiconductor laser element LD composed of a n-type AlGaAs first cladding layer 22, an AlGaAs or GaAs, in this embodiment, AlGaAs active layer 23 and a p-type AlGaAs second cladding layer 24 is formed on a n-type GaAs substrate 21 by crystal growth and selective etching based on MOCVD. Then, an insulating film 28 serving as a mask layer is formed so as to cover the upper surface of the laser element LD and the resonator end faces 27A, 27B.

As shown in FIG. 7B, a n-type GaAs layer 41 and a p-type GaAs layer 42 are formed on the n-type GaAs substrate 21 disposed behind the semiconductor laser element LD by crystal growth, thereby forming a light output monitoring photodiode $PD_1$ based on a pn junction.

In this embodiment, the n-type GaAS layer 41 and the p-type GaAs layer 42 are formed by crystal growth such that the pn junction j of the photodiode $PD_1$ is arranged on an extension of the position of the active layer 23 of the semiconductor laser element LD.

The pn junction j need not always be arranged on the extension of the position of the active layer 23. The pn junction j of the photodiode $PD_1$ is formed by crystal growth such that at least light traveling from the rearward of the laser element LD is radiated on the surface opposing the resonator end face 27B of the photodiode $PD_1$ including the pn junction j.

A reflection-preventing film 43 is formed on the surface of the photodiode $PD_1$ and thereby a target semiconductor laser device 45 can be obtained.

Also in the semiconductor laser device 45, similarly as described above, since the semiconductor laser element LD and the light output monitoring photodiode $PD_1$ based on crystal growth are monolithically formed on the same n-type GaAs substrate 21, the semiconductor laser device can be miniaturized and the alignment, such as alignment of optical axis can be removed. Further, since the photodiode $PD_1$ is formed such that the pn junction j is opposed to the active layer of the laser element LD, light 32B traveling from the rearward of the laser element LD directly radiates the pn junction portion to raise a light-receiving efficiency of the monitoring photodiode $PD_1$. Thus, the sensitivity can be increased much more.

Further, since the reflection-preventing film 43 is formed on the light-receiving surface of the photodiode $PD_1$, the light 32B traveling from the rearward of the laser element LD can be prevented from being reflected but can be introduced into the pn junction j. Thus, it is possible to increase the light-receiving efficiency much more.

Further, there is then the risk that light reflected on the light-receiving surface of the photodiode $PD_1$ becomes stray light to enter an optical lens system concerning the front light 32A which is aggressively utilized by the laser element LD. This reflection-preventing film 43 can reduce such risk.

Figure 8A:
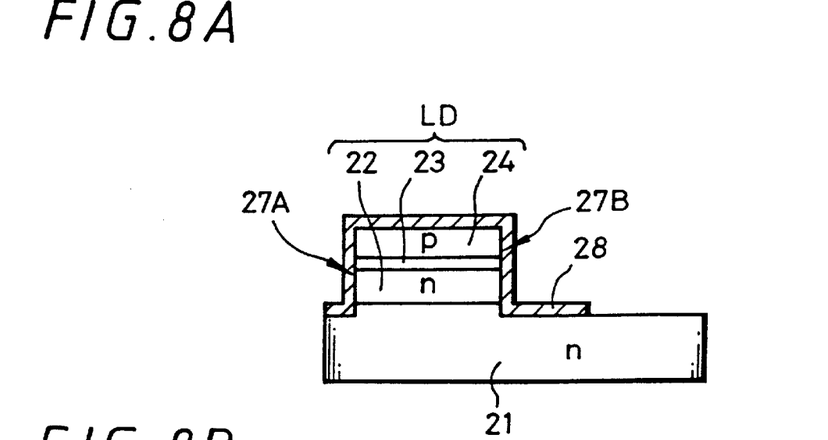
FIG. 8A is a side view showing an optical semiconductor laser device according to a fourth embodiment of the present invention and a manufacturing step thereof.
Figure 8B:
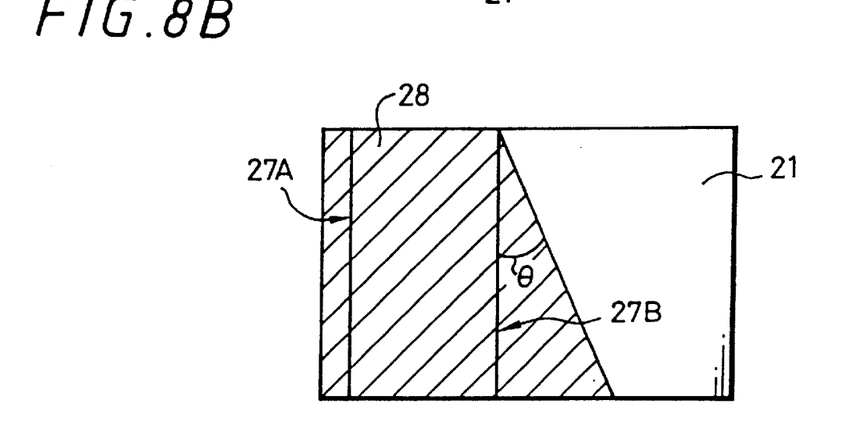
FIG. 8B is a plan view of FIG. 8A.
Figure 8C:
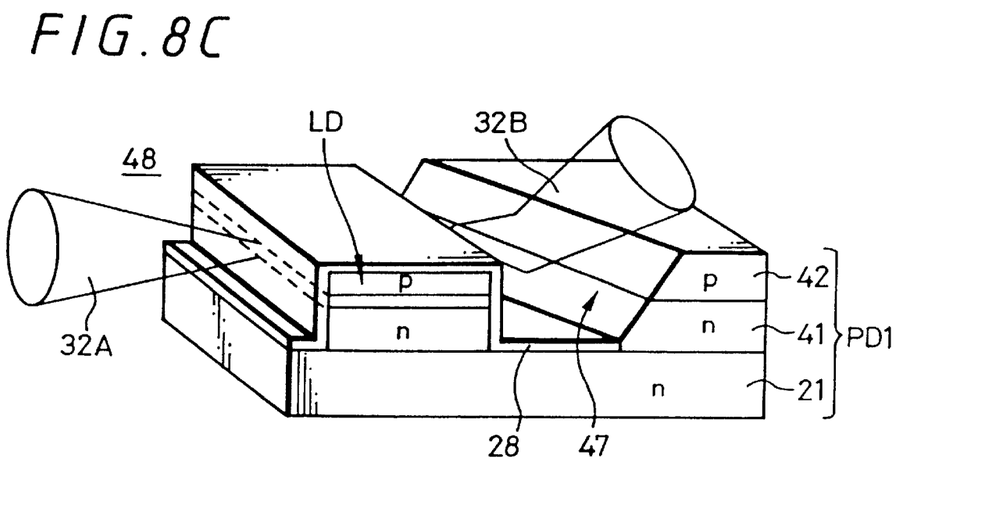
FIG. 8C is a perspective view showing an optical semiconductor laser device according to a fourth embodiment of the present invention and a manufacturing step thereof.

FIGS. 8A to 8C show a semiconductor laser device according to a fourth embodiment of the present invention and a manufacturing method thereof.

In the semiconductor laser device 45 shown in FIGS. 7A and 7B, the reflection-preventing film 43 is formed on the surface of the light output monitoring photodiode $PD_1$ to prevent output light from being reflected so that the output light can be introduced into the pn junction satisfactorily. However, even though the reflection-preventing film 43 is formed on the surface of the light output monitoring photodiode $PD_1$, the output light is reflected considerably and reflected light becomes stray light to enter the lens system. This embodiment can improve such defects.

According to this embodiment, as shown in FIG. 8A, through similar processes shown in FIGS. 5A to 5C, the semiconductor laser element LD composed of the n-type AlGaAs first cladding layer 22, the AlGaAs or GaAs, in this embodiment, AlGaAs active layer 23 and the p-type AlGaAS second cladding layer 24 is formed on the n-type GaAs substrate 21 by crystal growth and selective etching based on MOCVD.

The insulating film 28 serving as the mask layer is formed so as to cover the upper surface of the laser element LD and the resonator end faces 27A, 27B. A part of the insulating film 28 is extended on the surface of the rear n-type GaAs substrate 21 such that it does not become parallel to the resonator end face 27B as seen in a plan view, i.e., it progressively comes away from the resonator end face 27B toward the other end to one end of the resonator end face 27B with an inclination angle θ (see FIG. 8B).

Then, a n-type GaAs layer 41 and a p-type GaAs layer 42 similar to those of FIG. 7B are formed on the n-type GaAs substrate 21 at its rear portion disposed behind the laser element LD and in which the insulating film 28 is formed by crystal growth. Therefore, a light output monitoring photodiode $PD_1$ based on the pn junction j is thereby formed. The light output monitoring photodiode $PD_1$ obtained after the crystal growth has a surface 47 which is inclined relative to the resonator end face 27B.

The reflection-preventing film 43 shown in FIG. 7B may be formed or may not be formed on the surface of the photodiode $PD_1$.

Thus, as shown in FIG. 8C, there can be obtained a target semiconductor laser device 48 in which the semiconductor laser element LD and the light output monitoring photodiode $PD_1$ based on the pn junction having the light-receiving surface opposing the resonator end face 27B are monolithically formed on the same n-type GaAs substrate 21 and in which the light-receiving surface of the photodiode $PD_1$ is inclined by the predetermined angle θ such that the light-receiving surface does not become parallel to the resonator end face 27B of the laser element LD as seen in a plan view.

According to the semiconductor laser device 48, although laser light emitted from the rearward of the laser element LD is radiated on the light-receiving surface 47 of the light output monitoring photodiode $PD_1$ and a part thereof is reflected on the light-receiving surface, since the light-receiving surface 47 of the photodiode $PD_1$ is the inclined surface provided so as not to become parallel to the resonator end face 27B, reflected light (stray light) travels in the upper oblique direction and reflected in other direction. Thus, the reflected light can be prevented from entering the optical lens system or the like.

Also in the semiconductor laser device 48, similarly to the semiconductor laser device 45 shown in FIGS. 7A and 7B, since the laser element LD and the light output monitoring photodiode $PD_1$ are both monolithically formed on the semiconductor substrate 21, the semiconductor laser device 48 can be miniaturized. Also, the alignment such as alignment of optical axis need not be made and the semiconductor laser device 48 can be obtained with a high accuracy. Moreover, a light-receiving efficiency of the light output monitoring photodiode $PD_1$ can be improved and the photodiode $PD_1$ can be made high in sensitivity.

Figure 9:
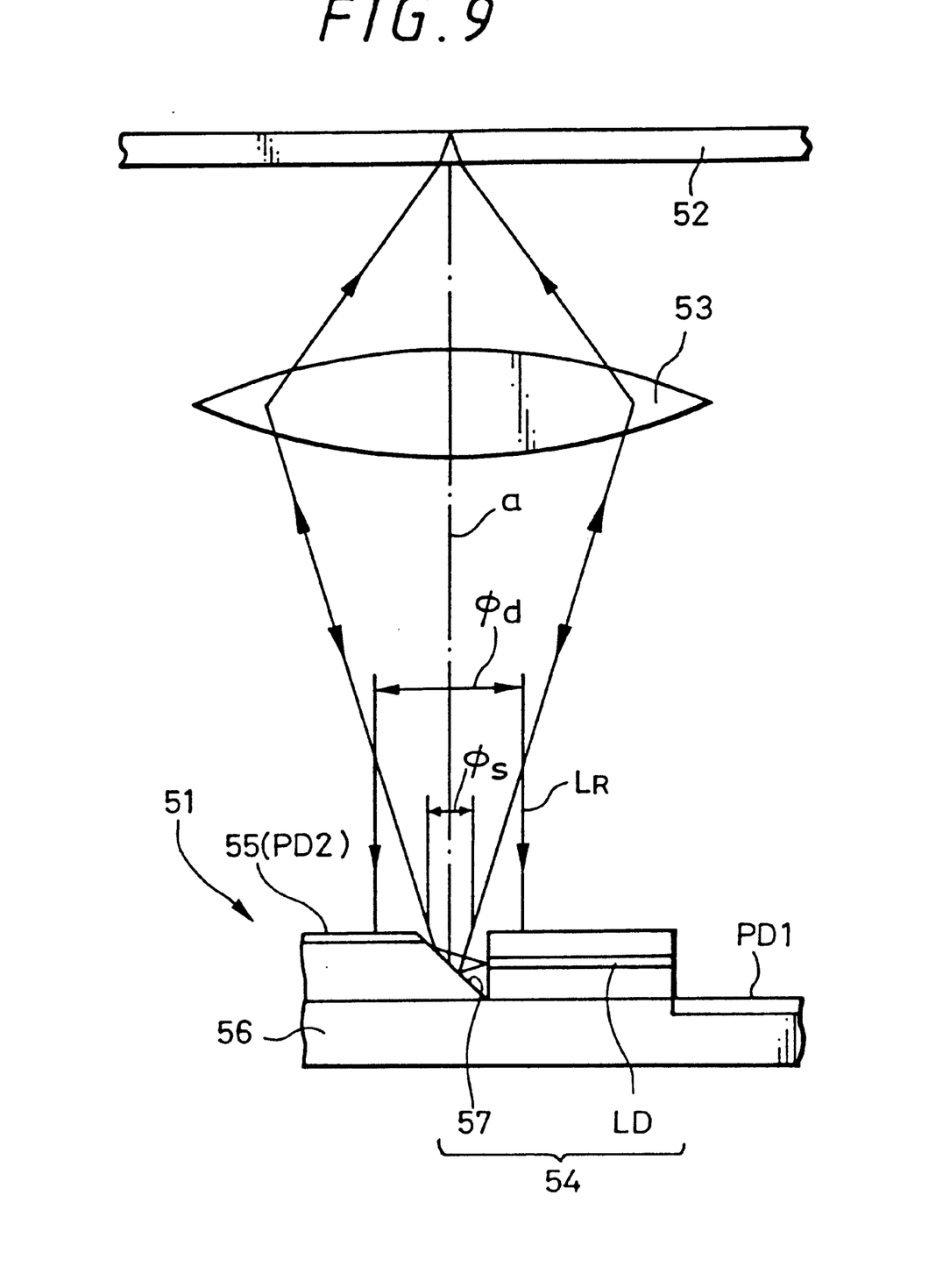
FIG. 9 is a schematic diagram showing an arrangement of an optical semiconductor device according to a fifth embodiment of the present invention.
Figure 10:
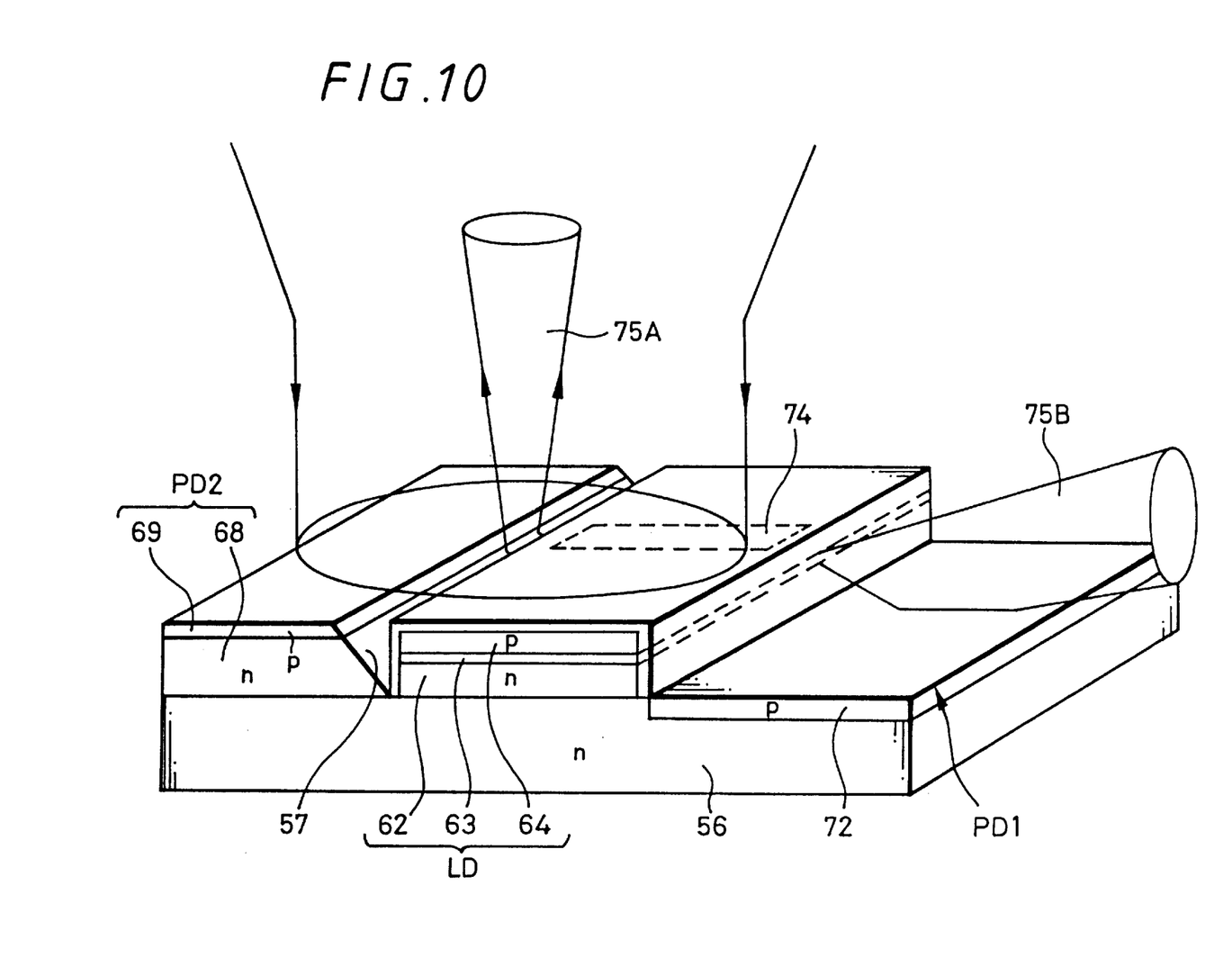
FIG. 10 is a perspective view showing an example of the optical semiconductor device shown in FIG. 9.

FIGS. 9 and 10 show a fifth embodiment of the present invention.

In this embodiment, the optical semiconductor laser device according to the present invention is applied to an optical device for detecting an optical signal in an optical recording medium, such as a magneto-optical disk and a compact disc.

In FIG. 9, reference numeral 51 designates an inventive optical device, 52 a radiated portion, such as an optical recording medium and 53 a converging means, i.e., condenser optical lens.

As shown in FIG. 9, the optical device 51 includes a light-emitting portion 54 and a light-receiving portion 55 integrally formed on a common substrate 56. Light from the light-emitting portion 54 is converged on and radiated on the radiated portion 52. Reflected-back light reflected from the radiated portion 52 is converged by the converging means 53 and received by the light-receiving portion 55 disposed near the confocal position of the converging means 53. With this arrangement, light emitted from the light-emitting portion 54 is traveled through the optical paths of the same axis and received by the light-receiving portion 55 before and after it is reflected by the radiated portion 52 as a one-dot chain line a shows an optical axis thereof.

In the optical device 51, the light-emitting portion 54 is composed of the semiconductor laser element LD having the horizontal resonator and the reflection mirror 57, and the light-receiving portion 55 is composed of a photodiode $PD_2$. Light emitted from the semiconductor laser element LD is reflected by the reflection mirror 57 and an optical path of the reflected light becomes coincident with an optical path through which light travels toward the radiated portion 52.

Reflected-back light $L_R$ traveling toward the light-receiving portion 55 is converged to the degree near a light diffraction limit. A part of the light-receiving portion 55 is located within this light diffraction limit, i.e., a distance of light emitted from the light-emitting portion 55 crossing the layout reference plane s of the light-receiving surface from the optical axis a falls within 1.22λ/NA where λ is the wavelength of light emitted from the light-emitting portion 54 and NA is the numerical aperture of the converging means 53.

In this case, as shown in FIG. 9, a diameter $\phi_s$ of light emitted from the light-emitting portion 54 at the layout reference plane S of the light-receiving surface of the light-receiving portion 55 is selected to be smaller than a diameter $\phi_d$ of the above light diffraction limit. Moreover, the effective area of the light-receiving portion 55 is located outside of the diameter $\phi_s$ of the light emitted from the light-emitting portion 54. If a semiconductor laser element is used as a light source of the light-emitting portion 54, then the diameter $\phi_s$ of the emitted light can fall in a range of about 1 to 2 μm. If on the other hand the numerical aperture NA of the converging means 53 falls in a range of 0.09 to 0.1 and the wavelength λ of the emitted light is abut 780 nm, then the diffraction limit, i.e., $\phi_d$ becomes about 1.22λ/NA≈10μm.

Then, the light-emitting portion 54 is located at one focus position of the converging means 53. To be concrete, a so-called waist of light emitted from the semiconductor laser element LD is located at the confocal position. The radiated portion 52 is located at the other focus position of the converging means 53.

In this optical device 51, if the light emitted from the light-emitting portion 54 is radiated through the converging means 53, i.e., the condenser optical lens on the optical recording medium of the radiated portion 52 located at the confocal position, then the reflected-back light which results from reflecting radiation light by the optical recording medium 52, i.e., the reflected-back light containing recording information is converged again by the converging means 53, introduced into the photodiode $PD_2$ of the light-receiving portion 55 located near the confocal position, and this reflected-back light is received and detected by the light-receiving portion 55. In other words, the reflected-back light is converted into an electrical signal and output as a reproduced signal.

At that time, if the light-receiving surface of the photo-diode $PD_2$ of the light-receiving portion 55 is located at the position including an area in which the distance from the optical axis a is larger than $\phi_s/2$ and falls at least within $\phi_d/2$, then the reflected-back light from the radiated portion 52 can be positively separated from the emitted light and detected by the light-receiving portion 54.

As shown in FIGS. 9 and 10, the optical device 51 according to this embodiment includes the light-emitting portion 54 and the light-receiving portion 55 integrally formed on the common substrate 56. Further, the light output monitoring light-receiving portion for monitoring a power of light emitted from the rearward of the light-emitting portion 54, i.e., the photo-diode $PD_1$ is integrally formed on the common substrate 56.

The optical device 51 according to this embodiment will be described together with a manufacturing method thereof.

Figure 11A:
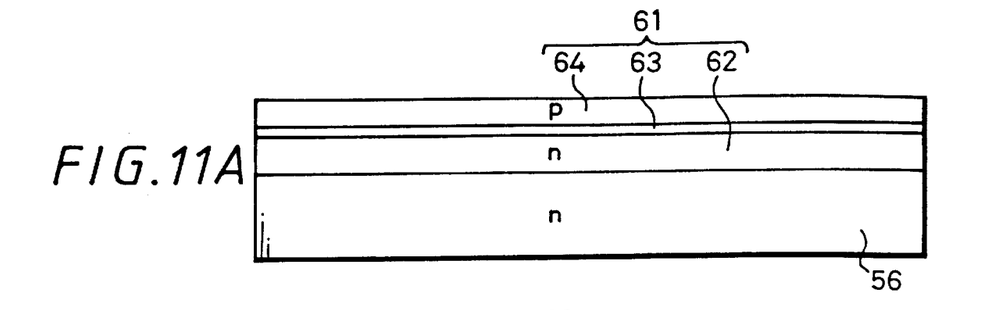
FIGS. 11A through 11E are side views showing manufacturing processes of the optical device shown in FIG. 9, respectively.

As shown in FIG. 11A, semiconductor layers forming a semiconductor laser element are epitaxially grown on the GaAs substrate using a first conductivity type, e.g., n-type {100} crystal plane as a major surface. Specifically, there is formed a laminated layer 61 in which an AlGaAs first cladding layer 62 of the same conductivity type (n type) as that of the substrate 61, an AlGaAs or GaAs, in this embodiment, GaAs active layer 63 and a second cladding layer 64 of a second conductivity type different from that of the first cladding layer, i.e., n type are sequentially epitaxially grown by MOCVD.

Figure 11B:
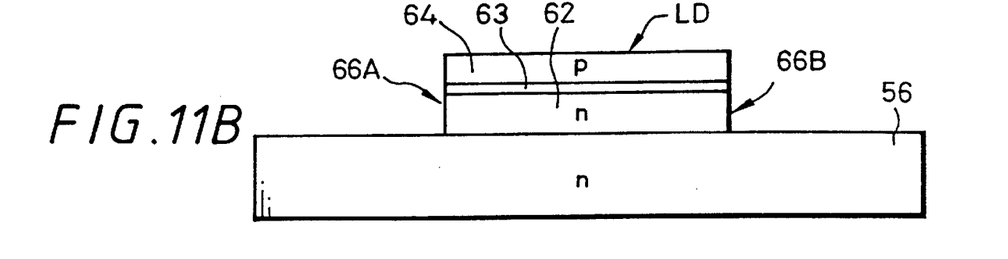

As shown in FIG. 11B, a part of the laminated film 61 that was epitaxially grown is left as a semiconductor laser element 58 and at least a portion in which the reflection mirror 57 and the photodiode $PD_2$ of the light-receiving portion 54 are formed finally and a portion in which the monitoring light-receiving portion, i.e., the photodiode $PD_1$ is finally formed are etched away by RIE (reactive ion etching).

Two end faces formed on the insulated film 61 by the etching surfaces are provided as one resonator end face 66A and the other resonator end face 66B of the semiconductor laser element. Then, a horizontal resonator forming the semiconductor laser element LD is formed between the two end faces 66A and 66B. In this case, though not shown, current-blocking regions are formed so as to sandwich a region to form a resonator of the semiconductor laser element LD by implanting ions of impurity.

Figure 11C:
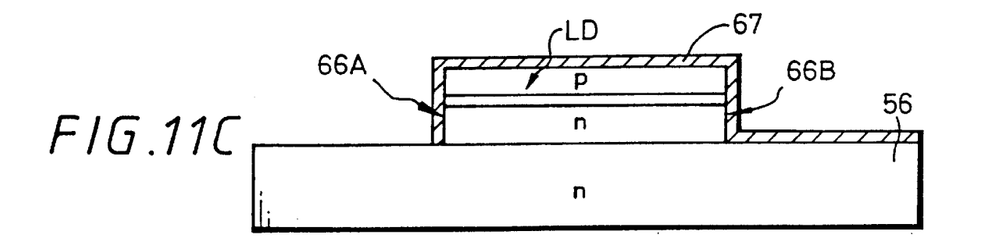

As shown in FIG. 11C, an insulating film 67 serving as a mask layer, such as $SiO_2$ and SiN is deposited so as to cover the portion on which the semiconductor laser element LD is formed and the surface of the substrate 56 extended rearward from the other resonator end face 66B.

Figure 11D:
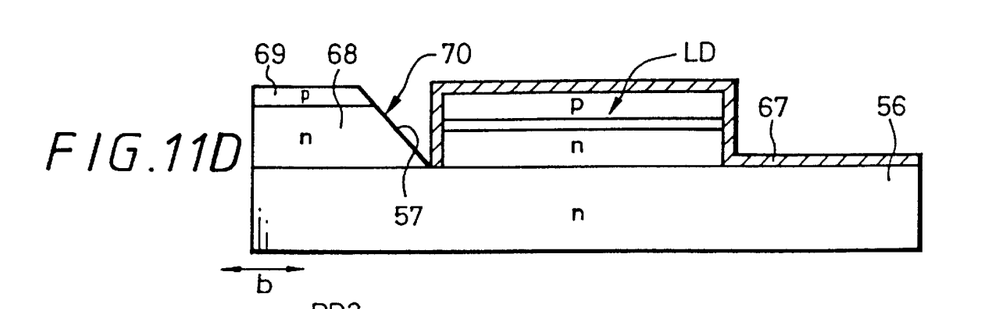

As shown in FIG. 11D, a first conductivity type, e.g., n-type GaAs first semiconductor layer 68 is selectively formed on the substrate 56 at its portion which is not covered with the insulating film 67 by MOCVD. Subsequently, a second conductivity type, e.g., p-type GaAs second semiconductor layer 69 is selectively formed on the first semiconductor layer 68 by MOCVD. The first and second semiconductor layers 68 and 69 constitute the light-receiving portion 54, i.e., the photodiode $PD_2$.

In this case, a surface opposing the resonator end face 66A of the first and second semiconductor layers 68 and 69 selectively epitaxially grown on the substrate 56 becomes a specified crystal plane. Assume now that a resonator length direction b of the horizontal resonator formed between the end faces 66A and 66B of the semiconductor laser element LD is [011] crystal axis direction. Then, the opposing surface 70 is generated as an inclined surface based on {111} A plane. Assume that the resonator length direction b is [0–11] crystal axis direction. Then, the opposing surface 70 is generated as an inclined surface based on {111} B plane. In any case, an angle formed by the opposing surface 70 and the plane surface of the substrate 56 becomes 54.7°.

When the resonator length direction b is taken as [100] crystal axis direction, the opposing surface 70 is generated as {110} plane and forms an angle of 45° between it and the plane surface of the substrate 56. In any case, the opposing surface 70 is formed as an inclined surface with a satisfactory morphology based on an atomic surface. Therefore, this inclined surface can be used as the reflection mirror 57 which reflects light emitted from the end face 66A of the semiconductor laser element LD in a predetermined direction. The reflection mirror 57 is formed by the crystal plane and has excellent property as a reflection mirror. Also, an inclination of the reflection mirror 57 can be set with a high accuracy.

Figure 11E:
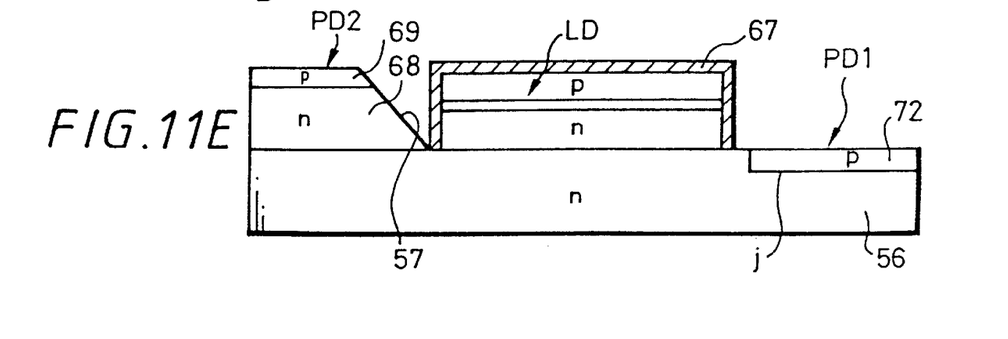

Then, as shown in FIG. 11E, the insulating film 68 on the n-type GaAs substrate 56 of the end face 66B of the semiconductor laser element LD is removed selectively. Then, a pn junction j is formed by forming a p-type semiconductor layer 72 on the substrate 56 at its surface in which the insulating film 68 is removed by diffusing Zn, for example. Thus, the light output monitoring photodiode $PD_1$ is formed.

Therefore, as shown in FIG. 10, there can be obtained the target optical device 51. In FIG. 10, reference numeral 74 designates a striped p-side electrode formed on the semiconductor laser element LD.

In the optical device 51, light 75B output from the resonator end face 66B disposed behind the laser element LD is received by the light output monitoring photodiode $PD_1$ formed on the substrate 546 by diffusion. An output signal from the photodiode $PD_1$ is fed back to the semiconductor laser element LD to make light power of light 75A emitted from the front of the semiconductor laser element LD constant.

According to the optical device 51, since the light-emitting portion 54 composed of the semiconductor laser element LD and the reflection mirror 57, the photodiode $PD_2$ for receiving the reflected-back light from the radiated medium after light was emitted from the light-emitting portion 54 and the photodiode $PD_1$ for monitoring a light output from the light-emitting portion 54 are monolithically integrated on the same n-type GaAs substrate 56, the optical device can be miniaturized. At the same time, it is possible to remove the alignment of optical axes of the semiconductor laser element LD and the monitoring photodiode $PD_1$. Moreover, since the monitoring light-receiving portion is composed of the photodiode $PD_1$ based on the pn junction j, the light-receiving area can be widened and the sensitivity of the monitoring light-receiving portion can be improved.

Accordingly, the optical semiconductor device according to this embodiment can be suitably applied to the optical pickup device for detecting an optical signal from recording media, such as an optical disk.

While the optical device 51 has the monitoring photodiode $PD_1$ formed by diffusion as described above, the present invention is not limited thereto and it is possible to form the monitoring photodiode $PD_1$ by crystal growth similarly to FIGS. 6A to 6C, FIGS. 7A and 7B and FIGS. 8A to 8C.

FIGS. 12A through 12D show an optical device according to a sixth embodiment of the present invention.

Figure 12A:
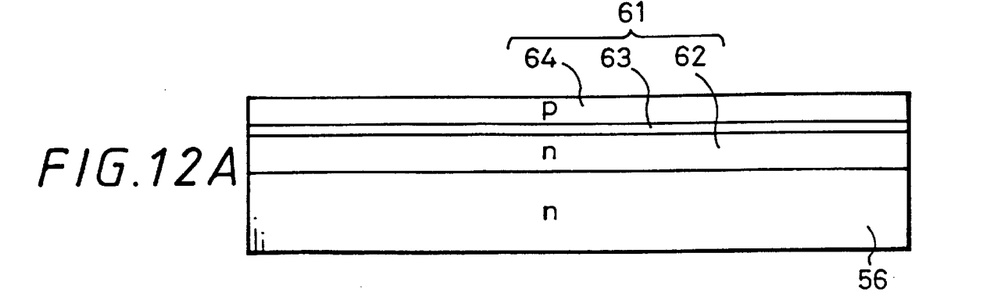
FIGS. 12A through 12D are side views showing manufacturing processes of an optical device according to a sixth embodiment of the present invention, respectively.
Figure 12B:
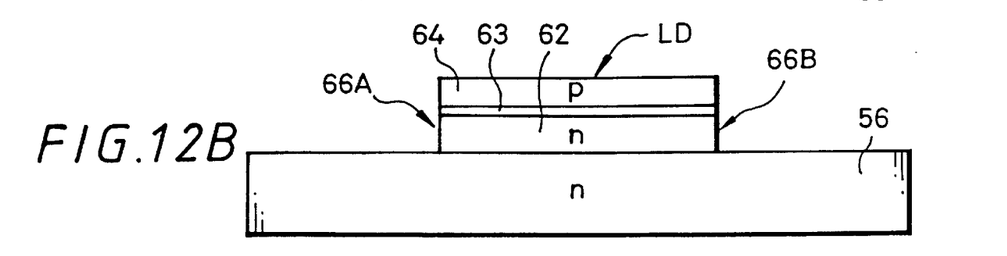

FIGS. 12A and 12B show similar processes to those of FIGS. 11A and 11B. Specifically, also in accordance with this embodiment, a first cladding layer 62, an active layer 63 and a second cladding layer 64 forming the semiconductor laser element are epitaxially grown on a first conductivity type, e.g., n-type GaAs substrate 56, in that order, by MOCVD and thereby an integrated film 61 is formed. Then, the semiconductor laser element LD is formed by selectively etching away the integrated film 61 by a suitable method, such as RIE.

Figure 12C:
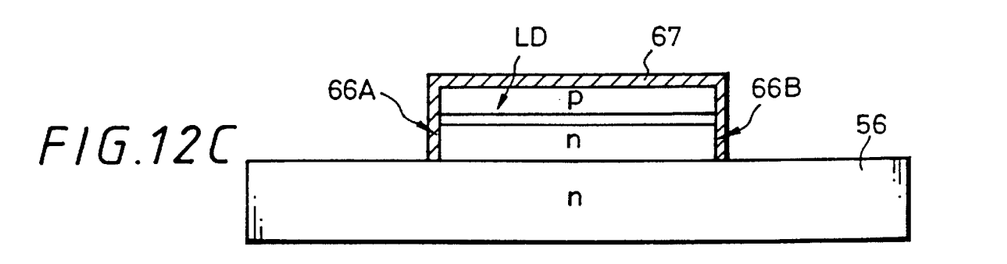

As shown in FIG. 12C, a mask layer, e.g., an insulating film 67 such as $SiO_2$ or SiN is deposited so as to cover the portion where the semiconductor laser element LD is formed.

Figure 12D:
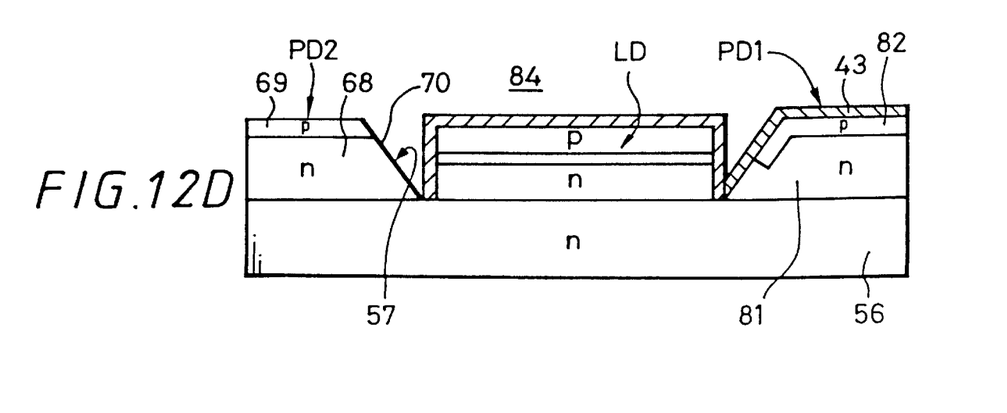

As shown in FIG. 12D, first conductivity-type, e.g., n-type GaAs first semiconductor layers 68 and 81 are selectively formed on the substrate 56 at its portion which is not covered with the insulating film 67 of the resonator end faces 66A, 66B of the semiconductor laser element LD by MOCVD. Subsequently, p-type GaAs second semiconductor layers 69 and 82 are formed by crystal growth or diffusion, in this embodiment, Zn diffusion. In this case, the first semiconductor layer 81 disposed behind the semiconductor laser element LD is formed by diffusing the area ranging from the upper surface of the semiconductor layer to the inclined surface opposing the resonator end face 66B. Thus, the first and second semiconductor layers 68 and 69 opposing the resonator end face 66A constitute one light-receiving portion 54, i.e., photodiode $PD_2$ and the first and second semiconductor layers 81 and 82 opposing the resonator end face 66B constitute a monitoring light-receiving portion, i.e., photodiode $PD_1$.

A surface 70 at which the first and second semiconductor layers 68 and 69 oppose the resonator end face 66A becomes the reflection mirror 57.

Then, the reflection-preventing film 43 is deposited on the surface of the monitoring photodiode $PD_1$.

In this way, it is possible to obtain a target optical device 84 shown in FIG. 12D.

Also in the optical device 84, since the light-emitting portion 54 composed of the semiconductor laser element LD and the reflection mirror 57, the photodiode $PD_2$ which becomes the light-receiving portion for receiving reflected-back light of light emitted from the light-emitting portion 54 and the monitoring photodiode $PD_1$ are monolithically integrated on the common substrate 56, the optical device including the monitoring light-receiving portion $PD_1$ can be miniaturized. Simultaneously, the alignment of optical axes need not be carried out.

In addition, since the reflection mirror 57, the photodiode $PD_2$ and the monitoring photodiode $PD_1$ are simultaneously formed by crystal growth, the manufacturing process can be simplified.

In this optical device 51, when the first semiconductor layers 68 and 81 are formed with an inclination angle of 54.7° with respect to the surface of the substrate 56, reflected light that was reflected on the monitoring photodiode $PD_1$ can be prevented from being introduced into the converging means, i.e., optical lens 53.

A modified example of the optical device 84 shown in FIGS. 12A through 12D will be described below. When the monitoring photodiode $PD_1$ is formed, as shown in FIGS. 8A to 8C, the insulating film 67 is obliquely extended from the resonator end face 66B to the surface of a part of the substrate 56 so that the light-receiving surface of the photodiode $PD_1$ is not made in parallel to the resonator end face 66B. At that time, light that was reflected on the light-receiving surface of the monitoring photodiode $PD_1$ is reflected in the upper oblique direction so that the reflected light can be prevented from being entering the optical lens 53.

While the light-emitting portion is composed of the semiconductor laser element as described above, the present invention is not limited thereto and the light-emitting portion can be composed of a light-emitting diode.

According to the inventive optical semiconductor device, since the light-emitting portion and the light-receiving portion for monitoring a light output of the light-emitting portion are formed on the semiconductor substrate, the light output emitted from the rearward of the light-emitting portion is received by the light-receiving portion and the output signal from the light-receiving portion is fed back with the result that a light output from the front of the light-emitting portion can be made constant.

Since the light-emitting portion and the light-receiving portion for monitoring a light output are monolithically formed on the same semiconductor substrate, the overall arrangement of the optical semiconductor device can be simplified and miniaturized. Further, it is possible to omit the alignment of optical axes between the light-emitting portion and the monitoring light-receiving portion. Furthermore, since the light-receiving portion is formed of the pn junction, it is possible to obtain a sufficiently high sensitivity.

When the monitoring light-receiving portion is formed on the semiconductor substrate by diffusion or selective growth, the monitoring light-receiving portion can be monolithically formed together with the light-emitting portion.

When the monitoring light-receiving portion is selectively grown to the position opposing the active layer of the light-emitting portion, the light-receiving surface of the light-receiving portion is opposed to the light-deriving end face of the light-emitting portion so that the light-receiving efficiency can be increased.

In this case, when the light-receiving surface of the monitoring light-receiving portion is formed such that the light-receiving surface is not made in parallel to the light-deriving end face of the light-emitting portion as seen in a plan view, even though the light output from the light-emitting portion is partly reflected on the light-receiving portion, the reflected light is reflected in the unnecessary direction. Thus, it is possible to prevent stray reflected light from being introduced into the optical system concerning light emitted from the front portion of the light-emitting portion.

When the reflection-preventing film is formed on the surface of the monitoring light-receiving portion, reflection on the light-receiving surface can be avoided and the light-receiving efficiency can be increased. Moreover, the occurrence of reflected-light can be reduced.

When the light-emitting portion and the monitoring light-receiving portion are formed on the same semiconductor substrate and another light-receiving portion for detecting reflected-back light obtained after light emitted from the light-emitting portion was reflected on the radiated portion at the confocal position is formed near the light-emitting portion, the optical semiconductor device according to the present invention is suitably applied to an optical device for detecting an optical signal from optical media, such as an optical disk. Moreover, the optical device can be simplified and miniaturized.

In this case, when the light-emitting portion is composed of the semiconductor laser having the horizontal resonator and the reflection mirror and the light output monitoring light-receiving portion and other light-receiving portion are composed of photodiodes, it is possible to realize the above-mentioned miniaturized optical device concretely.

According to a method of manufacturing an optical semiconductor device of the present invention, it is possible to manufacture with ease an optical semiconductor device in which the light-emitting portion and the light output monitoring light-receiving portion are monolithically integrated on the same semiconductor substrate.

When the monitoring light-receiving portion is formed on the semiconductor substrate by diffusion or selective growth, the monitoring light-receiving portion based on the pn junction can be monolithically formed together with the light-emitting portion.

In the above manufacturing method, when the monitoring light-receiving portion is selectively grown to the position opposing the active layer of the light-emitting portion, the light-receiving surface of the light-receiving portion can be opposed to the light-deriving end face of the light-emitting portion. Accordingly, it is possible to form the light-receiving portion with a high light-receiving efficiency in which light output from the light-emitting portion can be directly absorbed by the pn junction of the light-receiving portion.

When the reflection-preventing film is formed on the surface of the monitoring light-receiving portion, it is possible to form the light-receiving portion in which light can be prevented from being reflected on the light-receiving surface substantially.

When the above-mentioned manufacturing method has a step for forming another light-receiving portion on the semiconductor substrate in the vicinity of the light-emitting portion for receiving and detecting reflected-back light obtained after light emitted from the light-emitting portion was radiated on the radiated portion near the confocal position, it is possible to manufacture the optical device suitable for detecting an optical signal from optical media, such as an optical disk. In that case, it is possible to monolithically manufacture the optical device which includes the light-emitting portion, another light-receiving portion for detecting reflected-back light and the monitoring light-receiving portion.

When other light-receiving portion for receiving and detecting reflected-back light obtained after light emitted from the light-emitting portion was radiated on the radiated portion at the position near a confocal position is simultaneously formed near the light-emitting portion in the process in which the light output monitoring light-receiving portion is formed, it is possible to manufacture the above-mentioned optical device by simplified processes.

In the above-mentioned manufacturing process, since the light-emitting portion is composed of the semiconductor laser having the horizontal resonator and the reflection mirror and other light-receiving portion for detecting reflected-back light and the light output monitoring light-receiving portion are composed of photodiodes, it is possible to realize a manufacturing of the above-mentioned miniaturized optical device concretely.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method of manufacturing an optical semiconductor device comprising the steps of:

forming a laminated film on a semiconductor substrate to form a light-emitting portion comprised of a first cladding layer, an active layer and a second cladding layer;

forming said light-emitting portion by patterning and etching said laminated film; and forming a light output monitoring light-receiving portion comprising a pn junction by growing a crystal on said semiconductor substrate located behind said light-emitting portion and wherein said light-emitting portion and said light-receiving portion each have a different layered structure and wherein layout reference planes of the light-emitting portion crossing a layout reference plane of the light-receiving surface from the optical axis fall within a range of $1.22\lambda/NA$ where $\lambda$ is a wavelength of light emitted from the light emitting portion and NA is a numerical aperture of a converging lens.

2. A method of manufacturing an optical semiconductor device according to claim 1, wherein said light-receiving portion is formed on said light-emitting portion by selective growth.

3. A method of manufacturing an optical semiconductor device according claim 1, further comprising a step of forming a reflection-preventing film on the surface of said light-receiving portion.

4. A method of manufacturing an optical semiconductor device according to claim 1, further comprising a step of forming another light-receiving portion on said semiconductor substrate in the vicinity of said light-emitting portion, said another light-receiving portion receiving and detecting reflected-back light from a portion radiated by light emitted from said light-emitting portion near a confocal position wherein at least a part of said other light-receiving portion is disposed within a diffraction limit of reflected-back light.

5. A method of manufacturing an optical semiconductor device according to claim 4, wherein said another light-receiving portion for receiving and detecting reflected-back light from the portion radiated by light emitted from said light-emitting portion near a confocal position is formed near said light-emitting portion at the same time when said light output monitoring light-receiving portion is formed.

6. A method of manufacturing an optical semiconductor device according to claim 4, wherein said light-emitting portion is comprised of a semiconductor laser having a horizontal resonator and a reflection mirror and said light output monitoring light-receiving portion is comprised of a photodiode.

7. An optical semiconductor device comprising:

a single semiconductor substrate;

a light-emitting portion comprised of a first cladding layer; an active layer and a second cladding layer, said light emitting portion being formed on said single semiconductor substrate;

an insulating film formed over said light-emitting portion;

a light-receiving portion for monitoring light output formed on said semiconductor substrate located behind said light-emitting portion; and a second light-receiving portion formed on said single substrate for receiving light generated by said light-emitting portion which is reflected by a surface above said substrate and wherein layout reference planes of the light-emitting portion crossing a layout reference plane of the light-receiving surface from the optical axis fall within a range of $1.22\lambda/NA$ where $\lambda$ is a wavelength of light emitted from the light emitting portion and NA is a numerical aperture of a converging lens.

8. The optical semiconductor device of claim 7, wherein the light-emitting portion and the first and second light receiving portions are arranged substantially in a line.

9. The method of claim 4, wherein the light-emitting portion, the light-receiving portion and the other light-receiving portion are arranged to be substantially in a line.

* * * * *